(12) United States Patent
Connick et al.

(10) Patent No.: US 8,977,217 B1
(45) Date of Patent: Mar. 10, 2015

(54) SWITCHING DEVICE WITH NEGATIVE BIAS CIRCUIT

(71) Applicant: Triquint Semiconductor, Inc., Hillsboro, OR (US)

(72) Inventors: Richard Connick, Winter Garden, FL (US); Arjun Ravindran, Orlando, FL (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 157 days.

(21) Appl. No.: 13/772,277

(22) Filed: Feb. 20, 2013

(51) Int. Cl.
*H04B 1/44* (2006.01)
*H01L 21/70* (2006.01)
*H03K 17/687* (2006.01)
*H03K 17/16* (2006.01)

(52) U.S. Cl.
CPC .................. *H03K 17/165* (2013.01)
USPC .............................. 455/78; 257/368; 327/434

(58) Field of Classification Search
USPC ........ 455/78, 79, 83; 327/365, 389, 419, 427, 327/434; 257/288, 368
See application file for complete search history.

(56) References Cited

U.S. PATENT DOCUMENTS

| | | |
|---|---|---|
| 3,551,788 A | 12/1970 | Summer |
| 3,699,359 A | 10/1972 | Shelby |
| 4,053,916 A | 10/1977 | Cricchi et al. |
| 4,316,101 A | 2/1982 | Minner |
| 4,491,750 A | 1/1985 | Janutka |
| 5,012,123 A | 4/1991 | Ayasli et al. |
| 5,146,178 A | 9/1992 | Nojima et al. |
| 5,313,083 A | 5/1994 | Schindler |
| 5,416,043 A | 5/1995 | Burgener et al. |
| 5,492,857 A | 2/1996 | Reedy et al. |
| 5,548,239 A | 8/1996 | Kohama |
| 5,553,295 A | 9/1996 | Pantelakis et al. |
| 5,572,040 A | 11/1996 | Reedy et al. |
| 5,596,205 A | 1/1997 | Reedy et al. |
| 5,600,169 A | 2/1997 | Burgener et al. |
| 5,663,570 A | 9/1997 | Reedy et al. |
| 5,777,530 A | 7/1998 | Nakatuka |
| 5,801,577 A | 9/1998 | Tailliet |
| 5,818,099 A | 10/1998 | Burghartz |
| 5,861,336 A | 1/1999 | Reedy et al. |
| 5,863,823 A | 1/1999 | Burgener |
| 5,883,396 A | 3/1999 | Reedy et al. |
| 5,895,957 A | 4/1999 | Reedy et al. |

(Continued)

FOREIGN PATENT DOCUMENTS

| | | |
|---|---|---|
| CN | 1256521 | 6/2000 |
| EP | 0385641 | 9/1990 |

(Continued)

OTHER PUBLICATIONS

Non-Final Office Action in U.S. Appl. No. 13/587,590, dated Sep. 9, 2013.

(Continued)

*Primary Examiner* — Nguyen Vo
(74) *Attorney, Agent, or Firm* — Schwabe Williamson & Wyatt

(57) ABSTRACT

Embodiments provide a switching device including one or more field-effect transistors (FETs). In embodiments, a negative bias circuit is configured to generate a negative voltage signal based on a radio frequency (RF) signal applied to the circuit. When the FET is in an off state, the negative voltage signal is provided to a gate terminal of the FET.

22 Claims, 7 Drawing Sheets

(56) References Cited

U.S. PATENT DOCUMENTS

| | | | |
|---|---|---|---|
| 5,920,233 | A | 7/1999 | Denny |
| 5,930,638 | A | 7/1999 | Reedy et al. |
| 5,945,867 | A | 8/1999 | Uda et al. |
| 5,973,363 | A | 10/1999 | Staab et al. |
| 5,973,382 | A | 10/1999 | Burgener et al. |
| 6,057,555 | A | 5/2000 | Reedy et al. |
| 6,066,993 | A | 5/2000 | Yamamoto et al. |
| 6,160,292 | A | 12/2000 | Flaker et al. |
| 6,173,235 | B1 | 1/2001 | Maeda |
| 6,249,027 | B1 | 6/2001 | Burr |
| 6,308,047 | B1 | 10/2001 | Yamamoto et al. |
| 6,452,232 | B1 | 9/2002 | Adan |
| 6,504,212 | B1 | 1/2003 | Allen et al. |
| 6,563,366 | B1 | 5/2003 | Kohama |
| 6,631,505 | B2 | 10/2003 | Arai |
| 6,632,724 | B2 | 10/2003 | Henley et al. |
| RE38,319 | E | 11/2003 | Lin et al. |
| 6,642,578 | B1 | 11/2003 | Arnold et al. |
| 6,693,326 | B2 | 2/2004 | Adan |
| 6,790,747 | B2 | 9/2004 | Henley et al. |
| 6,804,502 | B2 | 10/2004 | Burgener et al. |
| 6,898,778 | B2 | 5/2005 | Kawanaka |
| 6,908,832 | B2 | 6/2005 | Farrens et al. |
| 6,924,673 | B2 | 8/2005 | Tanishima |
| 6,958,519 | B2 | 10/2005 | Gonzalez |
| 6,969,668 | B1 | 11/2005 | Kang et al. |
| 6,978,437 | B1 | 12/2005 | Rittman et al. |
| 6,989,706 | B2 | 1/2006 | Sekigawa |
| 7,056,808 | B2 | 6/2006 | Henley et al. |
| 7,057,472 | B2 | 6/2006 | Fukamachi et al. |
| 7,058,922 | B2 | 6/2006 | Kawanaka |
| 7,123,898 | B2 | 10/2006 | Burgener et al. |
| 7,138,846 | B2 | 11/2006 | Suwa |
| 7,158,067 | B2 | 1/2007 | Lauritzen |
| 7,404,157 | B2 | 7/2008 | Tanabe |
| 7,460,852 | B2 | 12/2008 | Burgener et al. |
| 7,616,482 | B2 | 11/2009 | Prall |
| 7,796,969 | B2 | 9/2010 | Kelly et al. |
| 7,860,499 | B2 | 12/2010 | Burgener et al. |
| 7,863,691 | B2 | 1/2011 | Wagner, Jr. et al. |
| 7,890,891 | B2 | 2/2011 | Stuber et al. |
| 7,910,993 | B2 | 3/2011 | Brindle et al. |
| 8,129,787 | B2 | 3/2012 | Brindle et al. |
| 8,159,283 | B2 | 4/2012 | Sugiyama |
| 2001/0015461 | A1 | 8/2001 | Ebina |
| 2001/0045602 | A1 | 11/2001 | Maeda et al. |
| 2002/0195623 | A1 | 12/2002 | Horiuchi |
| 2003/0002452 | A1 | 1/2003 | Sahota |
| 2003/0205760 | A1 | 11/2003 | Kawanaka et al. |
| 2004/0080364 | A1 | 4/2004 | Sander et al. |
| 2005/0167751 | A1 | 8/2005 | Nakajima et al. |
| 2007/0023833 | A1 | 2/2007 | Okhonin et al. |
| 2008/0073719 | A1 | 3/2008 | Fazan et al. |
| 2008/0076371 | A1 | 3/2008 | Dribinsky et al. |
| 2008/0303080 | A1 | 12/2008 | Bhattacharyya |
| 2009/0029511 | A1 | 1/2009 | Wu |
| 2011/0090022 | A1* | 4/2011 | Villain .......................... 333/103 |
| 2011/0227637 | A1 | 9/2011 | Stuber et al. |
| 2012/0169398 | A1 | 7/2012 | Brindle et al. |
| 2012/0267719 | A1 | 10/2012 | Brindle et al. |
| 2013/0029614 | A1* | 1/2013 | Cho et al. .................. 455/83 |
| 2014/0002171 | A1* | 1/2014 | Nohra .......................... 327/306 |
| 2014/0009214 | A1 | 1/2014 | Altunkilic |
| 2014/0227983 | A1* | 8/2014 | Clausen et al. ................. 455/78 |

FOREIGN PATENT DOCUMENTS

| | | |
|---|---|---|
| EP | 1006584 | 6/2000 |
| EP | 1451890 | 2/2011 |
| JP | 5575348 | 6/1980 |
| JP | 01254014 | 10/1989 |
| JP | 02161769 | 6/1990 |
| JP | 04183008 | 6/1992 |
| JP | 06334506 | 12/1994 |
| JP | 08148949 | 6/1996 |
| JP | 08307305 | 11/1996 |
| JP | 09284114 | 10/1997 |
| JP | 10242829 | 9/1998 |
| JP | 11136111 | 5/1999 |
| JP | 2003060451 | 2/2003 |
| JP | 3408072 | 5/2003 |
| JP | 2003189248 | 7/2003 |
| JP | 2004515937 | 5/2004 |
| WO | 9523460 | 8/1995 |
| WO | 0227920 | 4/2002 |
| WO | 2007008934 | 1/2007 |
| WO | 2007035610 | 3/2007 |

OTHER PUBLICATIONS

Non-Final Office Action in U.S. Appl. No. 13/742,086, dated Sep. 20, 2013.

Notice of Allowance in U.S. Appl. No. 13/587,590 dated Jan. 7, 2014.

Assaderaghi, et al.; "Dynamic Threshold-Voltage MOSFET (DTMOS) for Ultra-Low Voltage VLSI;" IEEE. vol. 44; No. 3; 414-421; Mar. 1997.

Bolam, R. et al., "Reliability Issues for Silicon-on-Insulator," Electron Devices Meeting Technical Digest, 2000, pp. 131-134.

Burgener, et al.; "CMOS SOS Switches Offer Useful Features, High Integration;" Microwaves & RF; 107-118; Aug. 2001.

Caverly, R. et al., "A Silicon CMOS Monolithic RF and Microwave Switching Element," 27th European Microwave Conference, Sep. 1997, pp. 1046-1051.

Caverly; "Linear and Nonlinear Characteristics of the Silicon CMOS Monolithic 50-Ω Microwave and RF Control Element;" IEEE. vol. 34; No. 1; 124-126; Jan. 1999.

Celler, et al.; "Smart Cut—A guide to the technology, the process, the products;" http://www.soitec.com/pdf/SmartCut_WP.pdf; Jul. 2003.

Chao, et al.; "High-Voltage and High-Temperature Applications of DTMOS with Reverse Schottky Barrier on Substrate Conctacts;" IEEE Electron Device Letters; vol. 25; No. 2; Feb. 2004; pp. 86-88.

Chung, I. et al., "SOI MOSFET Structure with a Junction-Type Body Contact for Suppression of Pass Gate Leakage," IEEE Transactions on Electron Devices, Jul. 2001, pp. 1360-1365, vol. 48, No. 7.

Dean; "Transistors, Theory and Circuitry." McGraw-Hill Publ. Co. Ltdl; 90-93; 1964.

Drake, et al.; "Dynamic-Threshold Logic for Low-Power VLSI Design." http://www.research.ibm.com/acas/projects/01drake.pdf; 2003.

Edwards, et al.; "The Effect of Body Contact Series Resistance on SOI CMOS Amplifier Stages;" IEEE Transactions on Electron Devices; vol. 44; No. 12; Dec. 1997; pp. 2290-2294.

Hameau, F. et al., "Radio-Frequency Circuits Integration Using CMOS SOI 0.25 μm Technology," 2002 RF IC Design Workshop Europe, Mar. 19-22, 2002, 6 pages.

Hess et al.; "Transformerless Capacitive Coupling of Gate Signals for Series Operation of Power MOS Devices;" IEEE; vol. 15; No. 5; Sep. 2000.

Hirano, Y. et al., "Impact of Actively Body-bias Controlled (ABC) SOI SRAM by using Direct Body Contact Technology for Low-Voltage Application," Electron Devices Meeting Technical Digest, 2003, pp. 2.4.1-2.4.4.

Hu, C. et al., "A Unified Gate Oxide Reliability Model," IEEE 37th Annual International Reliability Physics Symposium, 1999, pp. 47-51.

Huang et al.; "A 0.5-μm CMOS T/R Switch for 900-MHz Wireless Applications;" IEEE Journal of Solid-State Circuits; vol. 36; No. 3; Mar. 2001.

Iyama, et al.; "L-Band SPDT Switch Using Si-MOSFET;" The Institute of Electronics, Information and Communication Engineers (IEICE); 636-643; 1996.

Johnson, et al.; "Advanced Thin-Film Silicon-on-Sapphire Technology: Microwave Circuit Applications," IEEE; vol. 45; No. 5; May 1998.

Kuang, J. et al., "A floating-body charge monitoring technique for partially depleted SOI technology," Int. J. Electronics, Nov. 2004, pp. 625-637, vol. 91, No. 11.

(56) References Cited

OTHER PUBLICATIONS

Kuang, J. et al., "SRAM Bitline Circuits on PD SOI: Advantages and Concerns," IEEE Journal of Solid-State Circuits, Jun. 1997, pp. 837-844, vol. 32, No. 6.

Kuo, et al.; "Low-Voltage SOI CMOS VLSI Devices and Circuits;" Wiley Interscience, New York, XP001090589, pp. 57-60 and pp. 349-354; 2001.

Lauterbach, et al.; "Charge Sharing Concept and New Clocking Scheme for Power Efficiency and Electromagnetic Emission Improvement of Boosted Charge Pumps;" IEEE Journal of Solid-State Circuits; vol. 35; No. 5; pp. 719-723; May 2000.

Lee et al., "Effects of Gate Structures on the RF Performance in PD SOI MOSFETs," IEEE Microwave and Wireless Components Letters, Apr. 2005, pp. 223-225, vol. 15, No. 4.

Lee, et al.; "Effect of Body Structure on Analog Performance of SOI NMOSFETs;" Proceedings; 1998 IEEE International SOI Conference; Oct. 5-8, 1998; pp. 61-62.

Lee, H. et al., "Analysis of body bias effect with PD—SOI for analog and RF applications," Solid State Electronics, 2002, pp. 1169-1176, vol. 46.

Lee, H. et al., "Harmonic Distortion due to Narrow Width Effects in Deep sub-micron SOI-CMOS Device for analog-RF applications," 2002 IEEE International SOI Conference, Oct. 2002, pp. 83-85.

Li, et al.; "A 15-GHz Integrated CMOS Switch with 21.5-dBm IP1dB and 1.8-dB Insertion Loss;" IEEE; 2004 Symposium on VLSI Circuits; Digest of Technical Papers; Jun. 17-19, 2004.

Maeda, et al.; "Substrate-Bias Effect and Source-Drain Breakdown Characteristics in Body-Tied Short-Channel SOI MOSFET's;" IEEE Transactions on Electron Devices; vol. 46; No. 1; Jan. 1999; pp. 151-158.

Makioka, S. et al., "Super Self-Aligned GaAs RF Switch IC with 0.25 dB Extremely Low Insertion Loss for Mobile Communication Systems," IEEE Transactions on Electron Devices, Aug. 2001, pp. 1510-1514, vol. 48, No. 8.

Megahed, M. et al, "Low Cost UTSI Technology for RF Wireless Applications," IEEE MTT-S Digest, 1998, pp. 981-984.

Orndorff, et al.; "CMOS/SOS/LSI Switching Regulator Control Device;" Solid-State Circuits Conf.; Digest of Technical Papers; IEEE International; vol. XXI; pp. 234-235; Feb. 1978.

Phillips Semiconductors; "Single Pole Double Throw (SPDT) Switch, RF Communication Products;" IC17 Handbook; 1997.

Rodgers, P. et al., "Silicon UTSi CMOS RFIC for CDMA Wireless Communications Systems," IEEE MTT-S Digest, 1999, pp. 485-488.

Rozeau, O. et al., "SOI Technologies for Low-Power Low-Voltage Radio-Frequency Applications," Analog Integrated Circuits and Signal Processing, 2000, pp. 93-114, vol. 25.

Sedra, A. et al., Microelectronic Circuits, 1998, Fourth Edition, University of Toronto Press, Oxford University Press, pp. 374-375.

Sleight, J. et al., "Transient Measurements of SOI Body Contact Effectiveness," IEEE Electron Device Letters, Dec. 1998, pp. 499-501, vol. 19, No. 12.

Suehle et al., "Low Electric Field Breakdown of Thin SiO2 Films Under Static and Dynamic Stress," IEEE Transactions on Electron Devices, May 1997, pp. 801-808, vol. 44, No. 5.

Tinella, et al.; "A High-Performance CMOS-SOI Antenna Switch for the 2.5 5-GHz Band;" IEEE Journal of Solid-State Circuits; vol. 38; No. 7; Jul. 2003.

Wei, et al.; "Measurement of Transient Effects in SOI DRAM/SRAM Access Transistors;" IEEE Electron Device Letters; vol. 17; No. 5; May 1996.

Workman, et al.; "A Comparative Analysis of the Dynamic Behavior of BTG/SOI MOSFET's and Circuits with Distributed Body Resistance;" IEEE Transactions on Electron Devices; vol. 45; No. 10; Oct. 1998; pp. 2138-2145.

Yamamoto, et al.; A 2.2-V Operation, 2.4-GHz Single-Chip GaAs MMIC Transceiver for Wireless Applications; IEEE; vol. 34; No. 4; Apr. 1999.

Final Office Action in U.S. Appl. No. 13/742,086, dated Mar. 4, 2014.

\* cited by examiner

SWITCHING DEVICE WITH NEGATIVE BIAS CIRCUIT

FIELD

Embodiments of the present disclosure relate generally to the field of circuits, and more particularly to switching devices utilizing a field-effect transistor (FET).

BACKGROUND

For some field-effect transistor (FET)-based switching devices, a negative gate bias connection is used to facilitate off-mode operation. Present designs require the use of a charge pump and an oscillator to supply the negative voltage directly to the gate. The circuit elements used to implement such a design may be associated with spurious signals entering a radio frequency ("RF") switch core and larger die size.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in some embodiments" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, is used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Embodiments may include a switching device including a FET, a negative bias circuit, and a decoder circuit. The negative bias circuit may be configured to generate a negative voltage signal at an output terminal of the negative bias circuit based on a radio frequency (RF) signal applied to the switching device. The decoder circuit may be coupled with the output terminal of the negative bias circuit, and may be configured to couple the output terminal of the negative bias circuit with a gate terminal of the FET when the FET is in an off state.

Figure 1:
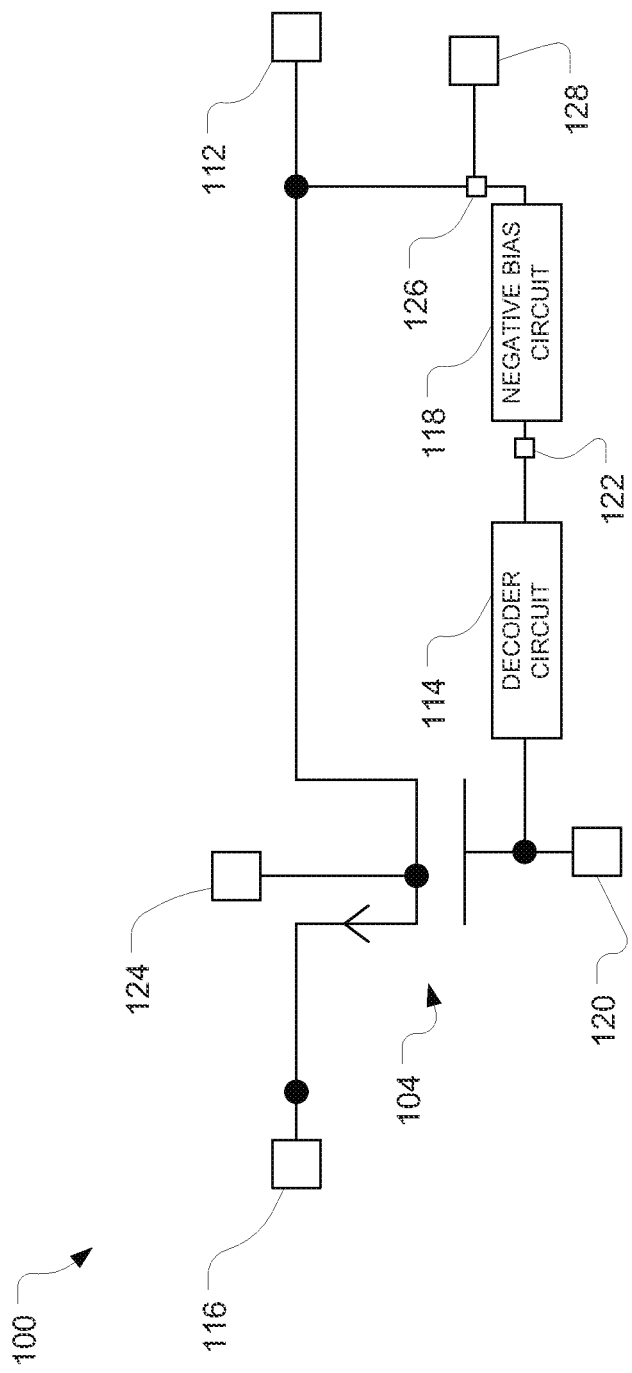
FIG. 1 is a diagram of a switching device in accordance with various embodiments.

FIG. 1 illustrates a switching device 100 in accordance with various embodiments. Switching device 100 (also referred to as device 100) may include a field-effect transistor (FET) 104. The FET 104 may include a drain terminal 112, a source terminal 116, a gate terminal 120, and a body terminal 124 coupled with a respective drain, source, gate, and body of the FET, as described below with reference to FIG. 2. In some embodiments, the FET 104 may be an enhancement mode FET. The FET 104 may be a silicon-on-insulator (SOI) device and/or a bulk complementary metal-oxide-semiconductor (CMOS) device. In some embodiments the FET 104 may be a metal-oxide-semiconductor FET (MOSFET), while in other embodiments the FET 104 may be referred to as an insulated-gate FET (IGFET) or a metal-insulator-semiconductor FET (MISFET).

Various embodiments provide a biasing scheme to be used in biasing the voltage of the gate of the FET 104. The biasing scheme is discussed herein with reference to an n-type FET. However, in other embodiments, the biasing scheme may be used and/or modified for use with another type of FET, such as a p-type FET.

In various embodiments, the FET 104 may selectively transition between an "off" state and an "on" state to facilitate switching of a transmission signal applied to the device 100, referred to herein as the RF signal. For example, when the RF signal is applied to the device 100, the FET 104 may receive the RF signal at the source terminal 116 or the drain terminal 112, and pass the RF signal through the FET 104 and to the drain terminal 112 or the source terminal 116, respectively, if the FET 104 is in the "on" state. The FET 104 may prevent the passage of the RF signal between the drain terminal 112 and the source terminal 116 if the FET 104 is in the "off" state. As used herein, "the RF signal applied to the device" may include an RF signal received at the source terminal 116 and selectively passed through to the drain terminal 112, or an RF signal received at the drain terminal 112 (e.g., from an RF antenna coupled to the drain terminal 112, or from another FET whose drain terminal is coupled to the drain terminal 112) and selectively passed through to the source terminal 116.

The FET 104 may receive a control signal at the gate terminal 120 to transition the FET 104 between the "off" state and the "on" state. For example, a positive DC voltage (e.g., +2.5V) with respect to the DC voltage of the drain terminal 112 and the source terminal 116 may be applied to the gate terminal 120. In some embodiments, the positive voltage may be applied by a decoder circuit 114, which may receive the positive voltage from a positive voltage source (not shown) and provide an electrical connection between the positive voltage source and the gate terminal 120. The decoder circuit 114 may include level shifting circuitry to adjust the positive voltage to a desired level; level shifting circuitry may alternatively be included in the switching device 100 separate from the decoder circuit 114. The positive voltage may have the effect of turning the FET 104 "on" by causing the resistance between the drain terminal 112 and the source terminal 116 to become very low so that an RF signal can pass between the drain terminal 112 and the source terminal 116.

Figure 2:
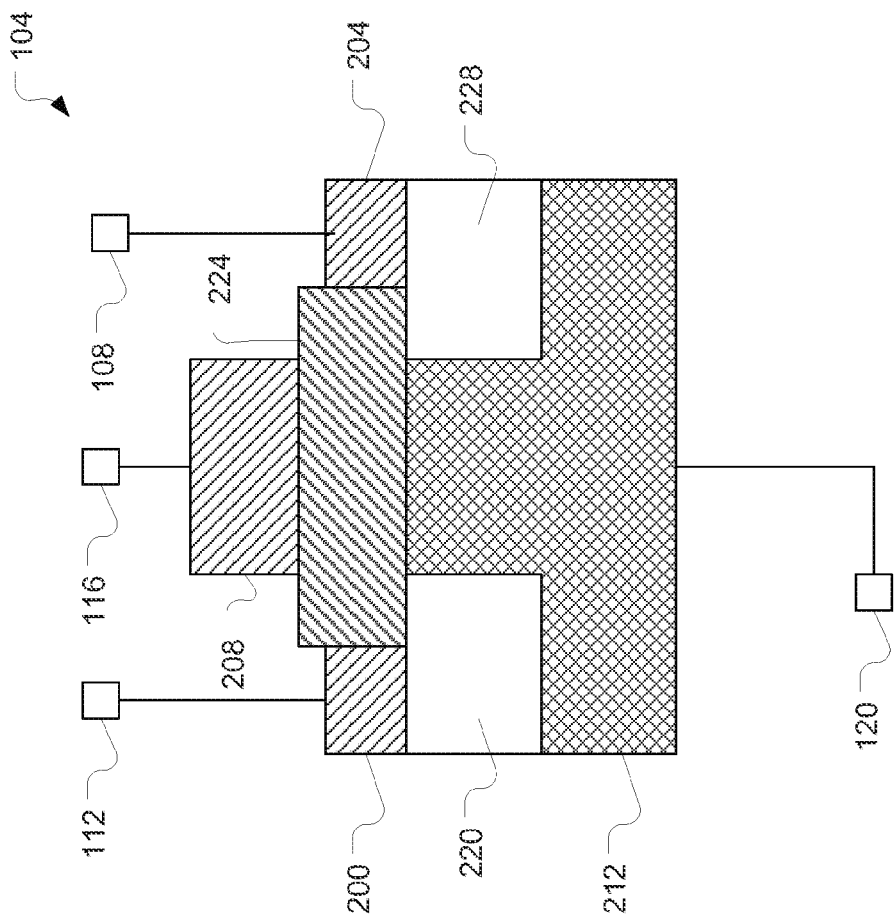
FIG. 2 illustrates an example of an n-type FET in accordance with various embodiments.

The application of a positive voltage to the gate terminal 120 may allow the RF signal to flow through the FET 104 because the FET 104 may generally include four parts as shown in the n-type metal-oxide-semiconductor (NMOS) FET 104 in FIG. 2. The FET 104 may include a drain 200 connected to the drain terminal 112, a source 204 connected to the source terminal 116, and a gate 208 connected to the gate terminal 120. In embodiments, the drain 200, the source 204, and the gate 208 may all include a metal or conductive material, for example aluminum or copper. In embodiments the drain 200, source 204, and gate 208 may include the same material, or different materials.

The FET 104 may further include a body 212 which is connected to the body terminal 124. The FET 104 may further include an n-type drain portion 220 positioned between the drain 200 and the body 212, and an n-type source portion 228 positioned between the source 204 and the body 212, as described in further detail below.

As used herein, "terminal" will generally be used to refer to the element of the FET 104 where the FET 104 connects to another element in a circuit. In some embodiments the drain 200 and the drain terminal 112 may be considered to be the same element, for example the FET 104 may connect to another element in a circuit via a direct connection between the drain 200 and the element in the circuit. In other embodiments the drain terminal 112 may be a terminal, for example a conductive lead, which is electrically coupled with the drain 200. For example, in these other embodiments, the FET 104 may connect with another element in the circuit via the drain terminal 112 which may be a metallic lead such as a copper or other conductive lead, which in turn may be coupled with the drain 200. Similarly, the source 204 and source terminal 116 may be the same as one another, or electrically coupled with one another, as described above with respect to the drain 200 and drain terminal 112. Similarly the gate 208 and the gate terminal 120 may be the same as one another, or electrically coupled with one another. Finally, the body 212 and the body terminal 124 may be the same as one another or coupled with one another. As used herein, the names given to the elements are for the purpose of distinguishing one element of the FET 104 from another, and different embodiments may use different names, for example calling the n-type drain portion 220 the "drain" or the n-type source portion 228 the "source" of the FET 104.

As an example of use of the FET 104, a DC voltage will be discussed as being applied to the gate terminal 120, which in turn may cause the gate 208 to gain the specified voltage. However, in some embodiments the DC voltage may be applied directly to the gate 208. As another example, the RF signal may be received at either the source 204 or the source terminal 116, and passed through the FET 104 when the FET 104 is "on," to the drain 200 or drain terminal 112. As another example, the RF signal may be received at either the drain 200 or the drain terminal 112, and passed through the FET 104 when the FET 104 is "on," to the source 204 or the source terminal 116.

The body 212 may be made up of a p-type material, for example a Group IV element such as silicon or germanium doped with Group III elements such as boron or aluminum. The n-type drain and source portions 220, 228, may include a Group IV element such as silicon or germanium doped with a Group V element such as arsenic or phosphorous. The n-type drain and source portions 220, 228 may be separated from one another by the body 212. In general, a p-type material is lacking electrons and is said to have "electron holes." An n-type material has extra electrons which may be able to move as an electric current within or out of the n-type material, and may therefore be said to have "mobile electrons."

As noted above, the gate 208 of the FET 104 may include a conductive metal such as copper or aluminum. In other embodiments, the gate 208 may include of tantalum, tungsten or tantalum nitride. In other embodiments, the gate 208 of the FET 104 may include a polysilicon material. The drain 200, source 204, gate 208, and body 212 may all be separated from one another by a dielectric 224, for example silicon dioxide, silicon oxynitride, or some other high-k dielectric that prevents the flow of electrons between the drain 200 and the source 204.

An electrostatic field may be created between the gate 208 and the rest of the FET 104 when the gate 208 gains a positive voltage due to a positive voltage applied to the gate terminal 120. The positive gate voltage may repel the electron holes in the p-type material of the body 212 while attracting the free electrons in the p-type material of the body 212. At the same time, the positive gate voltage may attract the mobile electrons in the n-type drain and source portions 220, 228. When the positive voltage of the gate 208 becomes high enough compared to the DC voltage of the drain 200 and the source 204, a voltage known as a "threshold voltage," the repulsion in the p-type material of the body 212, and the attraction of the free electrons in the body 212 and the mobile electrons in the n-type drain and source portions 220, 228, may create an electrical channel. The electrical channel is sometimes called an "inversion layer," and may be between the n-type drain and source portions 220, 228 and directly under the dielectric 224. In other words, the electrical channel between the n-type drain and source portions 220, 228 may be directly between the body 212 and the dielectric 224. In some embodiments, increasing the voltage applied to the gate terminal 120 may increase the voltage of the gate 208, which increases the size of the electrostatic field. The increase in the electrostatic field may increase the size of the electrical channel, and thus the amount of current that can be passed between the drain 200 and the source 204.

Similarly, a negative voltage of (e.g., −2.5V) may be applied to the gate terminal 120. In some embodiments, the negative voltage may be applied by the decoder circuit 114, which may receive a negative voltage signal from an output terminal 122 of a negative bias circuit 118 and provide an electrical connection between the output terminal 122 and the gate terminal 120. As discussed above, the decoder circuit 114 may include level shifting circuitry to adjust the positive voltage to a desired level; level shifting circuitry may alternatively be included in the switching device 100 separate from the decoder circuit 114. The negative bias circuit 118 may be configured to generate the negative voltage signal at the output terminal 122 based on the RF signal applied to the device 100 (e.g., by coupling with the drain terminal 112 as shown in FIG. 1, and/or by coupling with an RF antenna or one or more drain terminals of one or more other FETs, as discussed below). Embodiments of the negative bias circuit 118 are discussed in additional detail below (e.g., with reference to FIG. 3). A negative voltage applied to the gate terminal 120 may cause the resistance of the FET 104 as measured between the drain terminal 112 and the source terminal 116 to become very high so that no signal can pass between the drain terminal 112 and the source terminal 116. The resistance becomes high because the negative voltage at the gate terminal 120 causes the gate 208 to gain a negative voltage, thereby creating a negative electrostatic field. The negative electrostatic field simultaneously attracts the electron holes in the p-type body 212 and repels the mobile electrons in the n-type drain and source portions 220, 228, thereby negating the possibility of transferring electrons between the source 204 and the drain 200. In some embodiments, the decoder circuit 114 may be configured to couple the output terminal 122 of the negative bias circuit 118 with the gate terminal 120 when the FET 104 is in an off state. In embodiments where a p-type metal-oxide-semiconductor (PMOS) FET is used instead of the NMOS FET 104, the body 212 may be an n-type material and the drain and source portions 220, 228 may be p-type material.

In some embodiments, it may be desirable for the voltage of the body 212 to "follow," or have a similar voltage to, the voltage of the gate 208. This may be desirable because, for example, if the body 212 gains a positive voltage when a positive voltage is applied to the gate 208 or the gate terminal 120, then the electric channel between the drain 200 and the source 204 may be enhanced, thereby increasing the efficiency of the FET 104. Similarly, if the body 212 gains a negative voltage when a negative voltage is applied to the gate 208 or the gate terminal 120, then the repulsion of the n-type drain and source portions 220, 228 may be increased which will increase the resistance of the FET 104 and reduce any signal leakage. In some embodiments it may be desirable for the voltage of the body 212 to stay close to the voltage of the gate terminal 120, and in other embodiments it may be desirable for the voltage of the body 212 to only vary a small amount, for example a few tenths of a volt, when a voltage of +2.5V or −2.5V is applied to the gate terminal 120. Accordingly, in some embodiments, an active element such as a PMOS FET has been used as a diode, and coupled with the FET 104 between the body terminal 124 and the gate terminal 120 (not shown). When the voltage at the gate terminal 120 becomes negative, for example −2.5V, the diode may cause the voltage of the body 212 to become negative, and in many embodiments the voltage of the body 212 may be very close to the voltage at the gate terminal 120. For example, if the voltage at the gate terminal 120 is −2.5V, the voltage of the body 212 may be −2.3V. Other configurations in which the voltage of the body 212 follows the voltage of the gate 208 may also or alternatively be used. In some embodiments of the device 100, the output terminal 122 of the negative bias circuit 118 may be coupled to the body terminal 124 (e.g., via the decoder circuit 114) when the FET 104 is in an off state.

Figure 3:
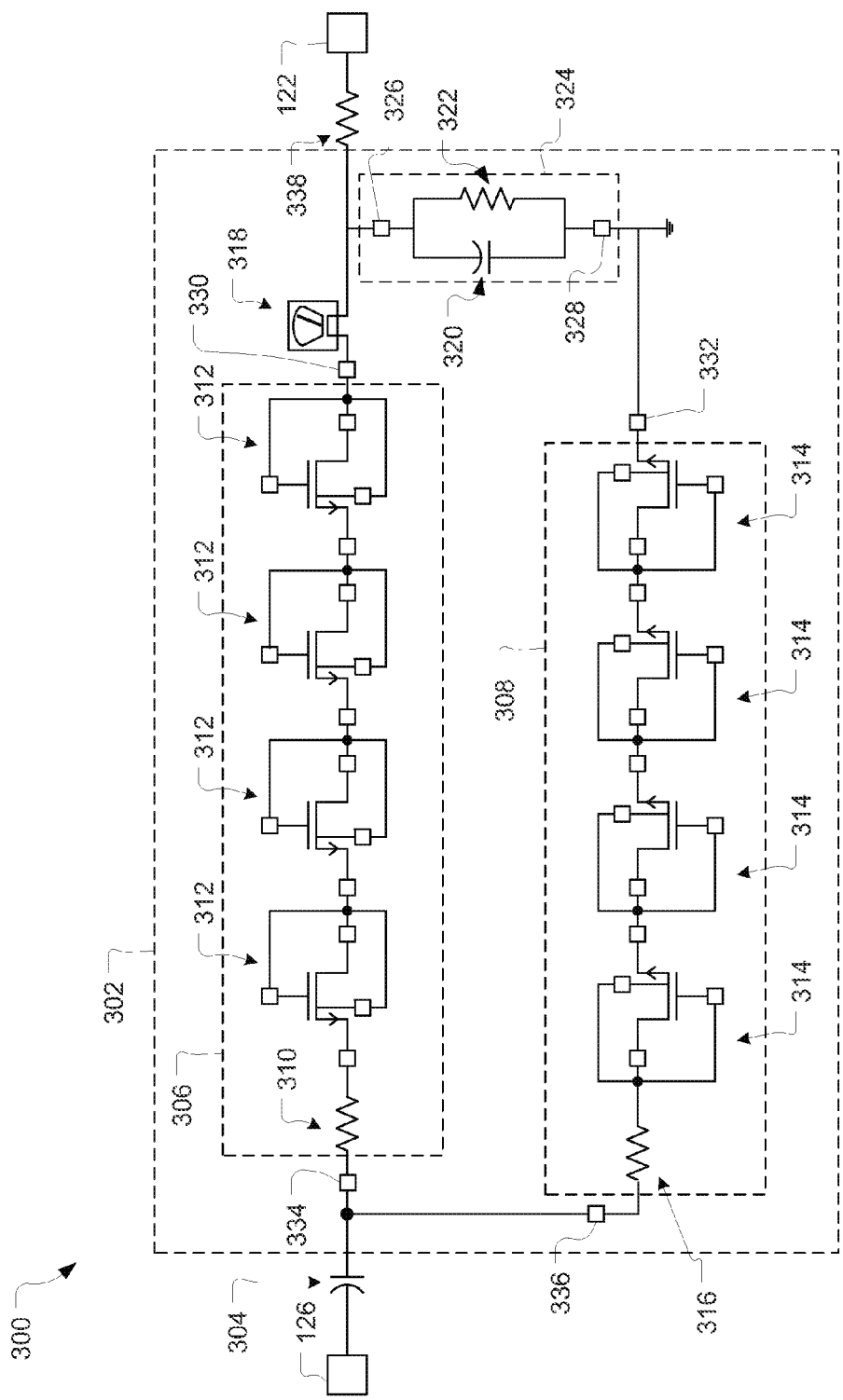
FIG. 3 is a diagram of a negative bias circuit in accordance with various embodiments.
Figure 6:
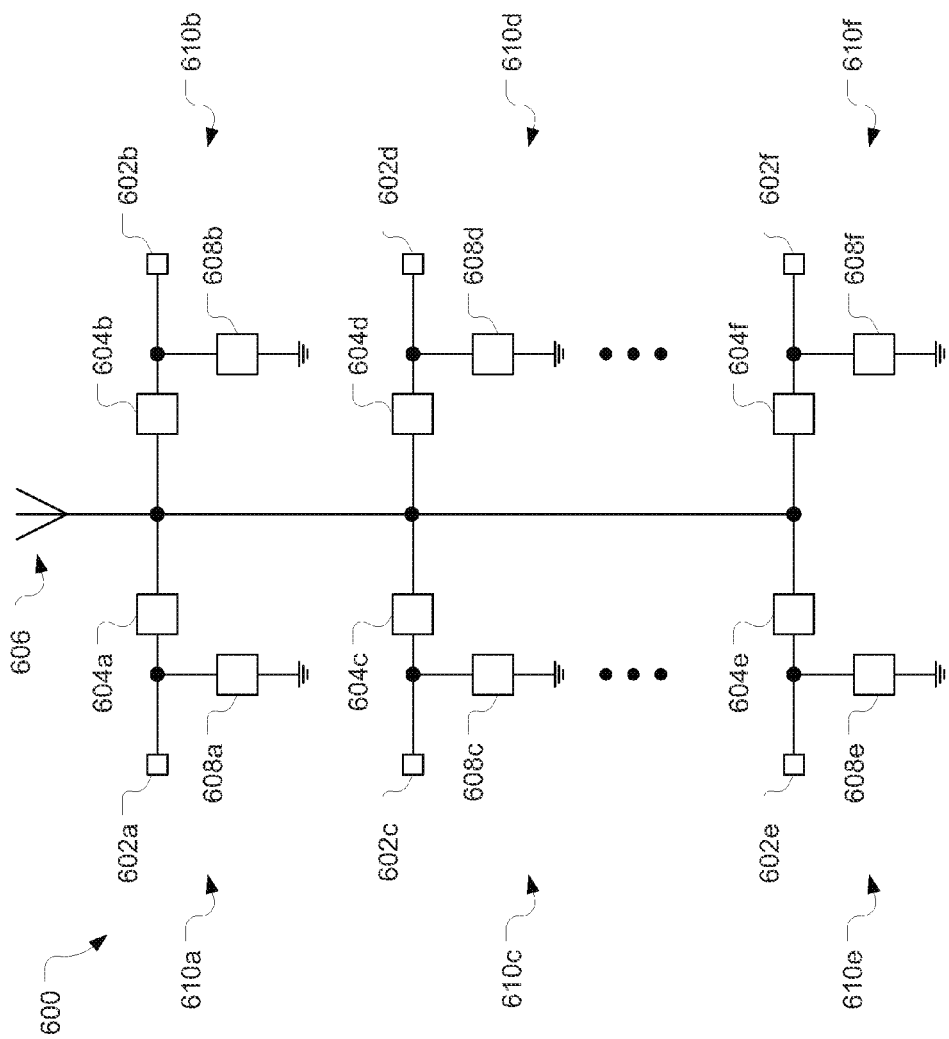
FIG. 6 is a diagram of a multiple throw switching device in accordance with various embodiments.

FIG. 3 is a diagram of the negative bias circuit 118 in accordance with various embodiments. As discussed above, the negative bias circuit 118 may be configured to generate a negative voltage signal at the output terminal 122 when the RF signal is applied to the device 100. The RF signal may be received at the input terminal 126 via an electrical coupling between the input terminal 126 and the drain terminal 112 (e.g., as shown in FIG. 1), and/or by coupling with an RF antenna or a drain terminal of a FET in an on state elsewhere in the circuit at terminal 128 (e.g., as shown in FIG. 6 and discussed below). In embodiments of the latter, an RF signal may be provided to terminal 128 even when the FET 104 is in an off state (e.g., when another FET in the switching device is in an on state). In some embodiments, the RF signal may be received at the input terminal 126 via an electrical coupling between the input terminal 126 and the source terminal 116 (not shown).

The negative bias circuit 118 may include a rectifier circuit 302 coupled between the input terminal 126 and the output terminal 122. The rectifier circuit 302 may include two half-wave rectifier branches having opposite polarities; as shown in FIG. 3, the rectifier circuit 302 includes a positive half-wave rectifier branch 306 (which may be referred to as the positive branch 306) and a negative half-wave rectifier branch 308 (which may be referred to as the negative branch 308). The positive branch 306 may have an input terminal 334 and an output terminal 330, and may include one or more diode-connected FETs 312 arranged in series. The positive branch 306 may also include a resistor 310 coupled between the input terminal 126 of the negative bias circuit 118 and the one or more diode-connected FETs 312. Although four diode-connected FETs 312 are illustrated in FIG. 3, any number of diode-connected FETs may be used. As used herein, a diode-connected FET may refer to a FET circuit in which the FET terminals are connected (possibly along with additional electrical components) such that the FET circuit operates substantially as a diode. For example, as shown in FIG. 3, a diode-connected FET may include a FET whose body, gate and drain terminals are electrically coupled. A diode-connected FET may include a FET whose gate and drain terminals are electrically coupled, without having the body terminal electrically coupled to the gate and drain terminals. Other configurations may additionally or alternatively be used.

In some embodiments, the negative bias circuit 118 includes a capacitor 304 coupled between the input terminal 126 of the negative bias circuit 118 and the input terminal 334 of the positive branch 306, which may reduce the magnitude of low frequency components (e.g., DC components) of the RF signal that reach the diode-connected FETs 312 in the positive branch 306. Additionally, the capacitor 304, the resistor 310 and the resistor 316 (discussed below) may act to limit the amount of current drawn into the negative bias circuit 118 from the drain terminal 112 (and, in some configurations, from an antenna coupled to the drain terminal 112), which may reduce the insertion loss and detrimental harmonics that may be introduced by the negative bias circuit 118.

The negative branch 308 may have an input terminal 336 and an output terminal 332, and may include one or more diode-connected FETs 314 arranged in series. The negative branch 308 may also include a resistor 316 coupled between the input terminal 126 and the one or more diode-connected FETs 314. Although four diode-connected FETs 314 are illustrated in FIG. 3, any number of diode-connected FETs may be used. In some embodiments, the number of diode-connected FETs 312 of the positive branch 306 may be the same as the number of diode-connected FETs 314 of the negative branch 308; in other embodiments, different numbers of diode-connected FETs may be included in each branch. The capacitor 304 is coupled between the input terminal 126 of the negative bias circuit 118 and the input terminal 316 of the negative branch 308, which may reduce the magnitude of low frequency components of the RF signal that reach the diode-connected FETs 314 of the negative branch 308 (as discussed above with reference to the positive branch 306).

The rectifier circuit 302 may include a probe 318 for measuring one or more voltages, one or more currents, or any one or more electrical or operational characteristics of the negative bias circuit 118. As shown in FIG. 3, the probe 318 is connected in series with the one or more diode-connected FETs 312 of the positive branch 306, but the probe 318 may be included anywhere in the negative bias circuit 118, including along the positive branch 306, the negative branch 308, or at any other position in the negative bias circuit 118.

The rectifier circuit 302 may also include a filter circuit 324 with a first terminal 326 and a second terminal 328. The first terminal 326 of the filter circuit 324 may be coupled with the output terminal 318 of the positive branch 306 (which may include an indirect coupling via the probe 318, as shown in FIG. 3). The second terminal 328 of the filter circuit 324 may be coupled with the output terminal of the negative branch 308. In some embodiments, the filter circuit 324 may include a capacitor 320 and a resistor 322 arranged in parallel between the first terminal 326 and the second terminal 328. In some embodiments, a resistor 338 may be coupled between the first terminal 326 of the filter circuit 324 and the output terminal 122 of the negative bias circuit 118. The negative voltage signal generated by the negative bias circuit 118 may be provided at the output terminal 122 for use in, e.g., biasing the gate terminal 120 of the FET 104 when the FET 104 is in an off state.

Various embodiments of negative bias circuits that generate a negative voltage signal based on an RF signal, such as the negative bias circuit 118, do not require a charge pump or oscillator and therefore may take up less die space than traditional negative voltage generators, which may allow the size of equipment that includes switching devices to be reduced. Additionally, by not requiring an oscillator for the generation of a negative voltage, various embodiments of the negative bias circuits disclosed herein may reduce the spurious noise introduced by oscillators.

Some switching devices may include a plurality of FETs such as FET 104. In some embodiments, the plurality of FETs may be in series with one another. It may be desirable to couple a plurality of FETs in series because, as noted above, when the FET 104 is turned "off," a large resistance is created between the source terminal 116 and the drain terminal 112. If the current of the RF signal is very large, then the FET 104 may be damaged. By coupling a plurality of FETs in series, the load created by the large RF signal may be distributed so that each FET is only bearing a portion of the load. In this manner, the lifetime of the FETs may be extended. In addition to one or more FETs arranged in a transmission line for transmitting the RF signal when the one or more FETs are in an on state, a switching device with multiple FETs may also include one or more FETs arranged as shunts between the source terminal of the first FET in the series line and ground.

Figure 4:
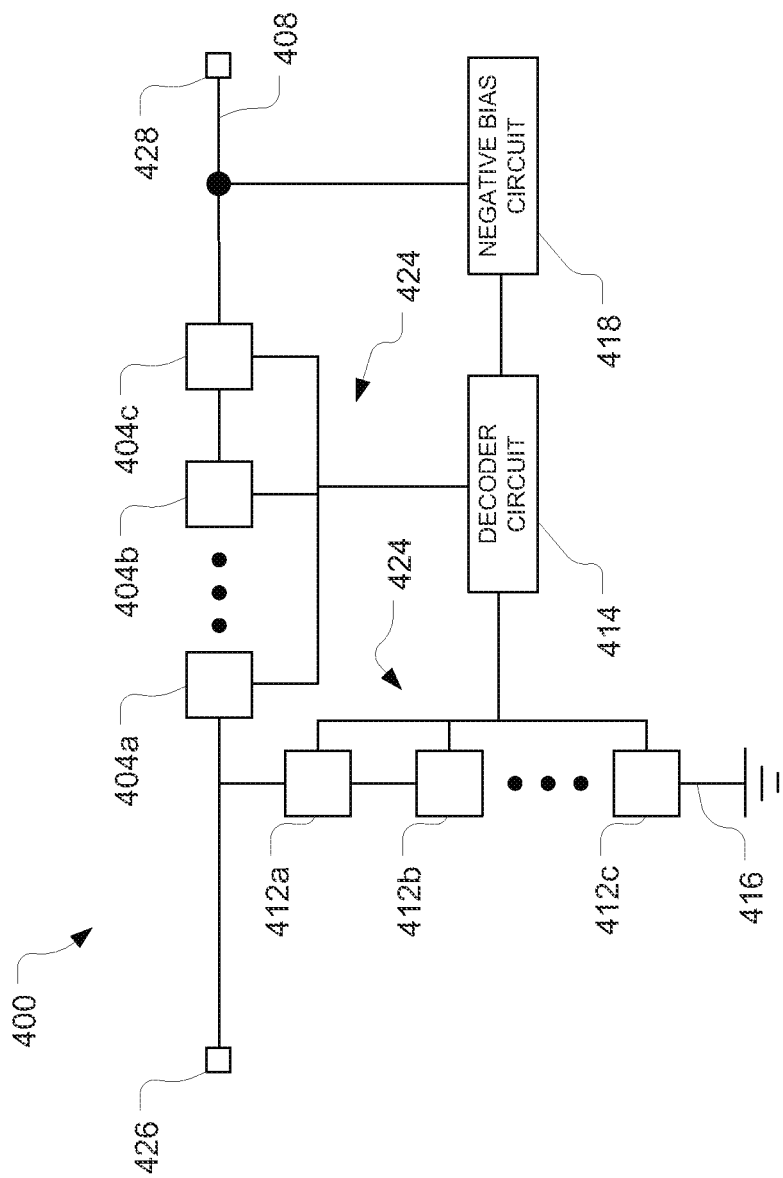
FIG. 4 is a diagram of a multiple-FET switching device in accordance with various embodiments.

FIG. 4 is a diagram of a multiple-FET switching device 400 in accordance with various embodiments. The switching device 400 may include one or more FETs 404 coupled in series with one another on an RF transmission line 408. In particular, the FET 404c and the FET 404b may be arranged such that the drain terminal of FET 404b is coupled with the source terminal of FET 404c.

The switching device 400 may further include one or more shunt FETs 412 coupled in series with one another on a shunt line 416. As discussed above with reference to multiple series FETs distributed along a transmission line, it may be desirable to couple a plurality of FETs in series along a shunt line as shown in FIG. 4 because, when the one or more FETs on the transmission line are in the off state, the load created by the large RF signal being shunted to ground along the shunt line may be distributed so that each FET is only bearing a portion of the load. In particular, the FET 412a and the FET 404a may be arranged such that the drain terminal of the FET 412a is coupled with the source terminal of the FET 404a. Individual FETs of the switching device 400 may be similar to FET 104 of FIG. 1.

The switching device 400 may further include a decoder circuit 414. The decoder 414 may be coupled with the FETs through decoder lines. In particular, a decoder line 424 may be provided to a gate terminal of each FET (and may additionally be provide to a body terminal of each FET). When the switching device 400 is in an on state, to pass the RF signal from an input terminal 426 to an output terminal 428, the decoder circuit 414 may set each of the transmission FETs 404 to an on state and may set each of the shunt FETs 412 to an off state. When the switching device 400 is in an off state, to prevent passage of the RF signal from the input terminal 426 to the output terminal 428, the decoder circuit 414 may set each of the transmission FETs 404 to an off state and may set each of the shunt FETs 412 to an on state. The decoder circuit 414 of the switching device 400 may be similar to the decoder circuit 114 of the switching device 100.

To provide a negative voltage to a FET of the switching device 400 to set the FET to an off state, the decoder circuit 414 may route the negative voltage signal generated by the negative bias circuit 418 to the FET (e.g., to the gate terminal of the FET). In particular, when the output of the negative bias circuit 418 is coupled with the gate terminal of the FET 404c (when the FET 404c is in an off state), the output of the negative bias circuit 418 may also be coupled with the gate terminal of the FET 404b (and all other FETs in the transmission line 408). When the FET 404a is in the off state, the output terminal of the negative bias circuit 418 is not coupled with the gate terminal of the shunt FETs 412 and the source terminal of the FET 412a is coupled with ground via the other FETs 412. The negative bias circuit 418 of the switching device 400 may be similar to the negative bias circuit 118 of the switching device 100.

Figure 5:
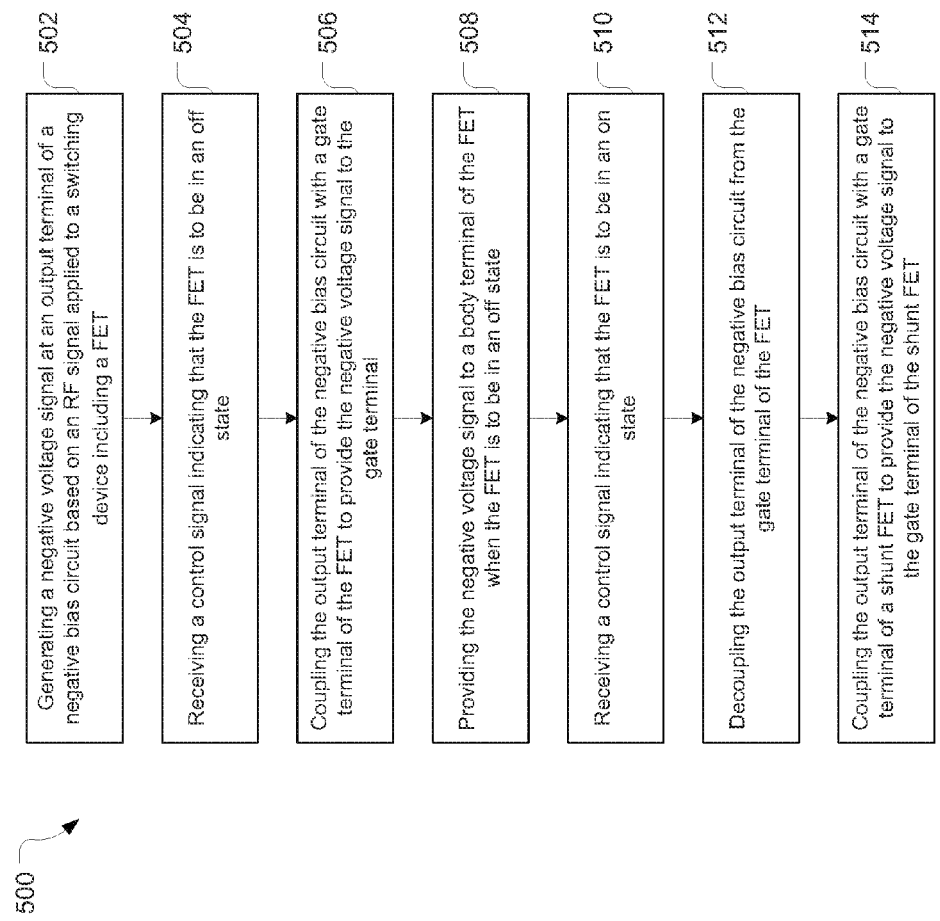
FIG. 5 is a flowchart of a method for providing a negative voltage signal to a gate terminal of a FET included in a switching device in accordance with various embodiments.

FIG. 5 is a flowchart of a method for providing a negative voltage signal to a gate terminal of a FET included in a switching device (such as the switching device 100 of FIG. 1 or the switching device 400 of FIG. 4), in accordance with various embodiments. At 502, a negative bias circuit (e.g., the negative bias circuit 118) generates a negative voltage signal at an output terminal of the negative bias circuit (e.g., the output terminal 122) based on an RF signal applied to a switching device including a FET (e.g., the switching device 100 including the FET 104).

At 504, a decoder circuit (e.g., the decoder circuit 114) receives a control signal indicating that the FET (e.g., the FET 104) is to be in an off state. At 506, the decoder circuit couples the output terminal of the negative bias circuit with a gate terminal of the FET (e.g., the gate terminal 120 the FET 104) of to provide the negative voltage signal to the gate terminal.

At 508, the decoder circuit or another component provides the negative voltage signal to a body terminal of the FET (e.g., the body terminal 124 of the FET 104) when the FET is in the off state. In some embodiments, 506 is optional.

At 510, the decoder circuit receives a control signal indicating that the FET is to be in an on state. At 512, in response to receiving the control signal at 510, the decoder circuit decouples the output terminal of the negative bias circuit from the gate terminal of the FET. In some embodiments, 510 and 512 are optional.

At 514, in response to receiving the control signal at 510, the decoder circuit couples the output terminal of the negative bias circuit with a gate terminal of a shunt FET (e.g., one of FETs 412 along shunt line 416 of FIG. 4) to provide the negative voltage signal to the gate terminal of the shunt FET. In some such embodiments, a drain terminal of the shunt FET may be coupled with a source terminal of the FET, and a source terminal of the shunt FET may be coupled with ground.

In some embodiments, a switching device includes multiple throws, each of which may be implemented using a FET-based switching device such as the switching device 100 or the switching device 400. FIG. 6 is a diagram of a multiple throw switching device 600 in accordance with various embodiments. The switching device 600 includes multiple inputs 602, which may be coupled with different RF signal sources (not shown). Each throw may be associated with at least one FET 604 along a transmission line between the associated input 602 and an antenna 606. Each throw may also be associated with at least one FET 608 along a shunt line between the associated input 602 and ground. The number and arrangement of FETs 604 along a transmission line may be different between throws, and the number and arrangement of FETS 608 along a shunt line may be different between throws.

The switching device 600 may further include a decoder circuit and a negative bias circuit (not shown for clarity of illustration). The decoder circuit may be similar to the decoder circuits 114 and 414, and the negative bias circuit may be similar to the negative bias circuits 118 and 418. The decoder 414 may be coupled with the FETs 604 and 608 through decoder lines (not shown). In particular, as discussed above with reference to FIG. 4 a decoder line may be provided to a gate terminal of each FET (and may additionally be provide to a body terminal of each FET). When a particular throw is selected to have the RF signal at its input 602 passed to the antenna 606, the decoder circuit may set the associated transmission FET 604 to an on state and the associated shunt FET 606 to an off state. The decoder circuit may also set all of the transmission FETs 604 associated with other throws to the off state, and all of the shunt FETs 606 associated with other throws to the on state. This will allow the RF signal at the input 602 of the selected throw to pass to the antenna with reduced interference from the RF signals associated with other throws.

To provide a negative voltage to a FET of the switching device 600 to set the FET to an off state, the decoder circuit may route the negative voltage signal generated by the negative bias circuit to the FET (e.g., to the gate terminal of the FET). For example, the drain terminal of the FET 604a of the throw 610a may be coupled with the drain terminal of the FET 604b of the throw 610b. When the throw 610b is selected, the decoder circuit may couple the output terminal of the negative bias circuit (e.g., the output terminal 122 of the negative bias circuit 118) to the gate of the FET 604a of the (non-selected) throw 610a and may not couple the output terminal of the negative bias circuit to the gate terminal of the FET 604b. The decoder circuit may instead couple a positive voltage to the gate terminal of the FET 604b, allowing the FET 604b to turn on and pass the RF signal at the input 602a to the antenna 606.

Figure 7:
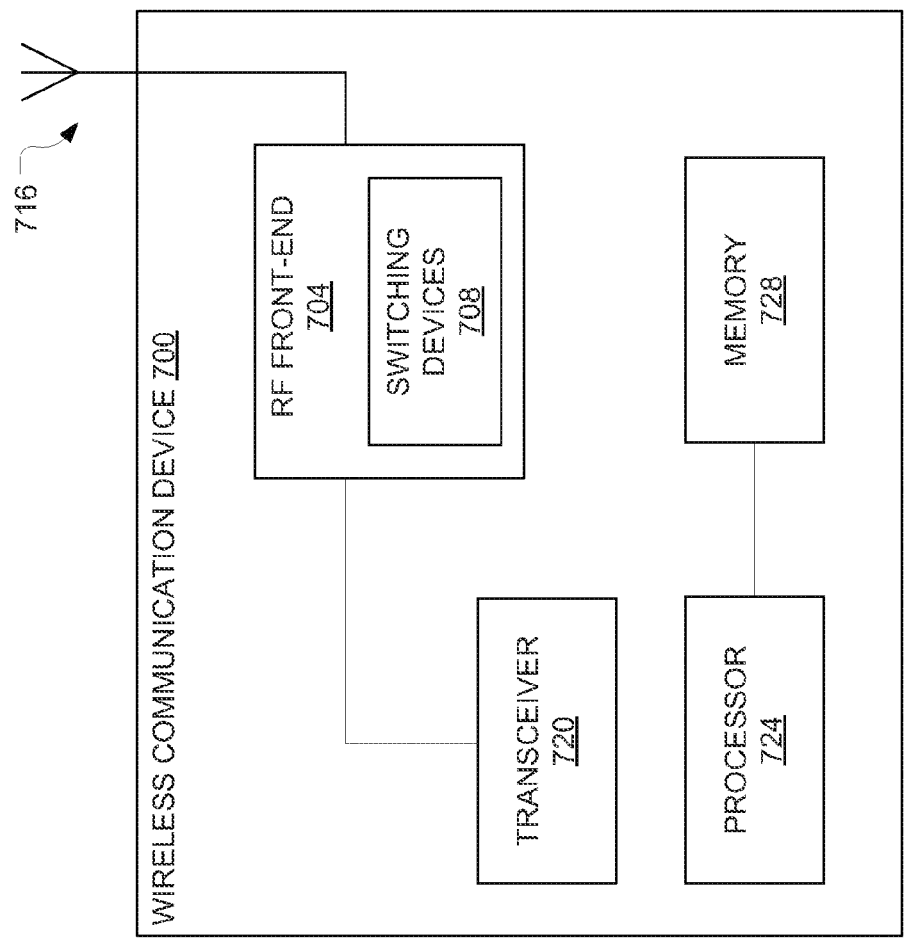
FIG. 7 is a block diagram of an exemplary wireless communication device in accordance with various embodiments.

FIG. 7 is a block diagram of a wireless communication device 700 in accordance with various embodiments. The wireless communication device 700 may have an RF front-end 704 including one or more switching devices 708. The switching devices 708 may be similar to and substantially interchangeable with any one or more of the switching devices 100, 400 and 600. In particular, in some embodiments, the switching devices 708 may include an SOI switching device that has a FET, a negative bias circuit configured to generate a negative voltage signal at an output terminal based on an RF signal applied to the switching device, and a decoder circuit coupled with the output terminal of the negative bias circuit and a gate terminal of the FET, where the decoder circuit is configured to couple the output terminal of the negative bias circuit with the gate terminal when the FET is in an off state.

The switching devices 708 may be deployed in various elements of the RF front-end 704 such as, but not limited to, an antenna switch module, a transmitter, a receiver, etc. The switching devices described herein may be particularly advantageously deployed in distribution switches included in the RF front-end 704. The RF front-end 704 may also include other elements not specifically shown or discussed such as, but not limited to, amplifiers, converters, filters, etc. While the wireless communication device 700 is shown with transmitting and receiving capabilities, other embodiments may include devices with only transmitting or only receiving capabilities. While the switching devices 708 are shown as included in the RF front-end 704, in some embodiments, the switching devices 708 may be included in other components of the wireless communication device 700, such as transceiver 720.

In addition to the RF front-end 704, the wireless communication device 700 may have an antenna 716, a transceiver 720, a processor 724, and a memory 728 coupled with each other at least as shown. The antenna 716 may be similar to the antenna 606.

The processor 724 may execute a basic operating system program, stored in the memory 728, in order to control the overall operation of the wireless communication device 700. For example, the processor 724 may control the reception of signals and the transmission of signals by the transceiver 720. The processor 724 may be capable of executing other processes and programs resident in the memory 728 and may move data into or out of the memory 728 as desired by an executing process.

The transceiver 720 may receive outgoing data (e.g., voice data, web data, e-mail data, signaling data, etc.) from the processor 724, may generate RF signal(s) to represent the outgoing data, and provide the RF signal(s) to the RF front-end 704. Conversely, the transceiver 720 may receive RF signals from the RF front-end 704 that represent incoming data. The transceiver 720 may process the RF signals and send incoming signals to the processor 724 for further processing.

The RF front-end 704 may provide various front-end functionality. The front-end functionality may include, but is not limited to, switching provided by the switching devices 708. In particular, the switching devices 708 may selectively pass RF signal(s) to, from, or within components of the wireless communication device 700.

In various embodiments, the antenna 716 may include one or more directional and/or omnidirectional antennas, including a dipole antenna, a monopole antenna, a patch antenna, a loop antenna, a microstrip antenna, or any other type of antenna suitable for transmission and/or reception of RF signals.

In various embodiments, the wireless communication device 700 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Those skilled in the art will recognize that the wireless communication device 700 is given by way of example and that, for simplicity and clarity, only so much of the construction and operation of the wireless communication device 700 as is necessary for an understanding of the embodiments is shown and described. Various embodiments contemplate any suitable component or combination of components performing any suitable tasks in association with the wireless communication device 700, according to particular needs. Moreover, it is understood that the wireless communication device 700 should not be construed to limit the types of devices in which embodiments may be implemented.

The following paragraphs describe examples of various embodiments. Various embodiments provide a switching device. The switching device may include a FET including a gate terminal; a negative bias circuit configured to generate a negative voltage signal at an output terminal of the negative bias circuit based on an RF signal applied to the switching device; and a decoder circuit coupled with the output terminal of the negative bias circuit and the gate terminal, the decoder circuit configured to couple the output terminal of the negative bias circuit with the gate terminal when the FET is in an off state.

In some embodiments of a switching device, the FET may be an n-type FET. The negative bias circuit may include an input terminal configured to receive the RF signal applied to the switching device and a rectifier circuit coupled between the input terminal and the output terminal. The rectifier circuit may include a first half-wave rectifier branch and a second half-wave rectifier branch, the first and second half-wave rectifier branches having opposite polarities. The first half-wave rectifier branch may include a diode-connected FET. The second half-wave rectifier branch may include a plurality of diode-connected FETs. The first half-wave rectifier branch may include a resistor coupled between the input terminal and the diode-connected FET.

In some embodiments of a switching device, the negative bias circuit may include a capacitor coupled between the input terminal and the first half-wave rectifier branch. In some embodiments, the switching device may include a silicon-on-insulator (SOI) circuit.

In some embodiments of a switching device, the FET may include a body terminal, and the output terminal of the negative bias circuit may be coupled to the body terminal when the FET is in an off state. The FET may be a first FET including a source terminal and the switching device may further include: a second FET including a gate terminal and a drain terminal, the drain terminal of the second FET coupled with the source terminal of the first FET. The output terminal of the negative bias circuit may be coupled with the gate terminal of the second FET when the first FET is in an off state.

In some embodiments of a switching device, the FET may be a first FET including a source terminal, and the switching device may further include a second FET including a source terminal, a gate terminal, and a drain terminal. The drain terminal of the second FET may be coupled with the source terminal of the first FET, the source terminal of the second FET may be coupled with ground, and the output terminal of the negative bias circuit may not be coupled with the gate terminal of the second FET when the first FET is in an off state.

In some embodiments of a switching device, the FET may be a first FET including a drain terminal, and the switching device may further include a second FET including a gate terminal and a drain terminal. The drain terminal of the second FET may be coupled with the drain terminal of the first FET, and the output terminal of the negative bias circuit may not be coupled with the gate terminal of the second FET when the first FET is in an off state.

Various embodiments provide a wireless communication device. The wireless communication device may include a transceiver, an antenna, and an RF front-end coupled with the transceiver and the antenna and configured to communicate signals between the transceiver and the antenna. The RF front-end may include an SOI switching device that has: a FET including a gate terminal, a negative bias circuit configured to generate a negative voltage signal at an output terminal based on an RF signal applied to the switching device, and a decoder circuit coupled with the output terminal of the negative bias circuit and the gate terminal. The decoder circuit may be configured to couple the output terminal of the negative bias circuit with the gate terminal when the FET is in an off state.

In some embodiments of a wireless communication device, the negative bias circuit may include an input terminal configured to receive the RF signal applied to the switching device and a rectifier circuit coupled between the input terminal and the output terminal. The rectifier circuit may include a first half-wave rectifier branch and a second half-wave rectifier branch, the first and second half-wave rectifier branches having opposite polarities. The first half-wave rectifier branch may include a plurality of diode-connected FETs. In some embodiments of a wireless communication device, the FET may include a body terminal, and the output terminal of the negative bias circuit may be coupled to the body terminal when the FET is in an off state.

Various embodiments provide a method that may include: generating, with a negative bias circuit, a negative voltage signal at an output terminal of the negative bias circuit based on an RF signal applied to a switching device including a FET; receiving, at a decoder circuit, a control signal indicating that the FET is to be in an off state; and coupling, by the decoder circuit, the output terminal of the negative bias circuit with a gate terminal of the FET to provide the negative voltage signal to the gate terminal. The method may further include providing the negative voltage signal to a body terminal of the FET when the FET is to be in the off state. The method may further include receiving, at the decoder circuit, a control signal indicating that the FET is to be in an on state; and in response to receiving the control signal indicating that the FET is to be in the on state, decoupling, with the decoder circuit, the output terminal of the negative bias circuit from the gate terminal of the FET. The method may further include, in response to receiving the control signal indicating that the FET is to be in the on state, coupling, by the decoder circuit, the output terminal of the negative bias circuit with a gate terminal of a shunt FET to provide the negative voltage signal to the gate terminal of the shunt FET. In such embodiments, a drain terminal of the shunt FET may be coupled with a source terminal of the FET, and a source terminal of the shunt FET may be coupled with ground.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A switching device comprising:
   a field-effect transistor (FET) including a gate terminal;
   a negative bias circuit configured to generate a negative voltage signal at an output terminal of the negative bias circuit based on a radio frequency (RF) signal applied to the switching device; and
   a decoder circuit coupled with the output terminal of the negative bias circuit and the gate terminal, the decoder circuit configured to couple the output terminal of the negative bias circuit with the gate terminal when the FET is in an off state.

2. The switching device of claim 1, wherein the FET is an n-type FET.

3. The switching device of claim 1, wherein the negative bias circuit includes an input terminal configured to receive the RF signal applied to the switching device and a rectifier circuit coupled between the input terminal and the output terminal.

4. The switching device of claim 3, wherein the rectifier circuit includes a first half-wave rectifier branch and a second half-wave rectifier branch, the first and second half-wave rectifier branches having opposite polarities.

5. The switching device of claim 4, wherein the first half-wave rectifier branch includes a diode-connected FET.

6. The switching device of claim 5, wherein the second half-wave rectifier branch includes a plurality of diode-connected FETs.

7. The switching device of claim 5, wherein the first half-wave rectifier branch includes a resistor coupled between the input terminal and the diode-connected FET.

8. The switching device of claim 4, wherein the negative bias circuit includes a capacitor coupled between the input terminal and the first half-wave rectifier branch.

9. The switching device of claim 1, wherein the FET includes a body terminal and the output terminal of the negative bias circuit is coupled to the body terminal when the FET is in an off state.

10. The switching device of claim 1, wherein the FET is a first FET including a source terminal and the switching device further comprises:
    a second FET including a gate terminal and a drain terminal, the drain terminal of the second FET coupled with the source terminal of the first FET;
    wherein the output terminal of the negative bias circuit is coupled with the gate terminal of the second FET when the first FET is in an off state.

11. The switching device of claim 1, wherein the FET is a first FET including a source terminal and the switching device further comprises:
    a second FET including a source terminal, a gate terminal, and a drain terminal, wherein the drain terminal of the second FET is coupled with the source terminal of the first FET, the source terminal of the second FET is coupled with ground, and the output terminal of the negative bias circuit is not coupled with the gate terminal of the second FET when the first FET is in an off state.

12. The switching device of claim 1, wherein the FET is a first FET including a drain terminal and the switching device further comprises:
    a second FET including a gate terminal and a drain terminal, the drain terminal of the second FET is coupled with the drain terminal of the first FET;
    wherein the output terminal of the negative bias circuit is not coupled with the gate terminal of the second FET when the first FET is in an off state.

13. The switching device of claim 1, wherein the switching device comprises a silicon-on-insulator (SOI) circuit.

14. A wireless communication device comprising:
    a transceiver;
    an antenna; and
    a radio frequency (RF) front-end coupled with the transceiver and the antenna and configured to communicate signals between the transceiver and the antenna, the RF front-end including a silicon-on-insulator (SOI) switching device that has:
       a field-effect transistor (FET) including a gate terminal;
       a negative bias circuit configured to generate a negative voltage signal at an output terminal based on a radio frequency (RF) signal applied to the switching device; and
       a decoder circuit coupled with the output terminal of the negative bias circuit and the gate terminal, the decoder circuit configured to couple the output terminal of the negative bias circuit with the gate terminal when the FET is in an off state.

15. The wireless communication device of claim 14, wherein the negative bias circuit includes an input terminal configured to receive the RF signal applied to the switching device and a rectifier circuit coupled between the input terminal and the output terminal.

16. The wireless communication device of claim 15, wherein the rectifier circuit includes a first half-wave rectifier branch and a second half-wave rectifier branch, the first and second half-wave rectifier branches having opposite polarities.

17. The wireless communication device of claim 16, wherein the first half-wave rectifier branch includes a plurality of diode-connected FETs.

18. The wireless communication device of claim 14, wherein the FET includes a body terminal and the output terminal of the negative bias circuit is coupled to the body terminal when the FET is in an off state.

19. A method comprising:
    generating, with a negative bias circuit, a negative voltage signal at an output terminal of the negative bias circuit based on a radio frequency (RF) signal applied to a switching device including a field-effect transistor (FET);
    receiving, at a decoder circuit, a control signal indicating that the FET is to be in an off state; and
    coupling, by the decoder circuit, the output terminal of the negative bias circuit with a gate terminal of the FET to provide the negative voltage signal to the gate terminal.

20. The method of claim 19, further comprising:
    providing the negative voltage signal to a body terminal of the FET when the FET is to be in the off state.

21. The method of claim 19, further comprising:
    receiving, at the decoder circuit, a control signal indicating that the FET is to be in an on state; and
    in response to receiving the control signal indicating that the FET is to be in the on state, decoupling, with the decoder circuit, the output terminal of the negative bias circuit from the gate terminal of the FET.

22. The method of claim 21, further comprising:
    in response to receiving the control signal indicating that the FET is to be in the on state, coupling, by the decoder circuit, the output terminal of the negative bias circuit with a gate terminal of a shunt FET to provide the negative voltage signal to the gate terminal of the shunt FET;

wherein a drain terminal of the shunt FET is coupled with a source terminal of the FET, and a source terminal of the shunt FET is coupled with ground.

* * * * *